(12) United States Patent
Fifield et al.

(10) Patent No.: US 7,541,834 B1
(45) Date of Patent: Jun. 2, 2009

(54) SYSTEM AND THE METHODS OF MANAGING A SET OF PROGRAMMABLE FUSES ON AN INTEGRATED CIRCUIT

(75) Inventors: John Atkinson Fifield, Underhill, VT (US); Michael Richard Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/121,373

(22) Filed: May 15, 2008

Related U.S. Application Data

(63) Continuation-in-part of application No. 12/103,519, filed on Apr. 15, 2008.

(51) Int. Cl.
*H03K 19/173* (2006.01)
*H01H 37/76* (2006.01)
(52) U.S. Cl. .......................... 326/38; 326/16; 327/525
(58) Field of Classification Search .................. 326/16, 326/37–38, 47–50; 327/525, 408
See application file for complete search history.

(56) References Cited

U.S. PATENT DOCUMENTS

| 5,510,731 | A | 4/1996 | Digwall |
| 5,896,041 | A * | 4/1999 | Sher et al. .................. 326/38 |
| 6,087,852 | A | 7/2000 | Briggs et al. |
| 6,100,719 | A | 8/2000 | Graves |
| 6,782,499 | B2 | 8/2004 | Osada et al. |
| 6,836,146 | B2 * | 12/2004 | Zimlich ..................... 326/38 |
| 7,315,193 | B2 * | 1/2008 | Anand et al. ............... 327/525 |
| 2005/0052204 | A1 | 3/2005 | Chun |

FOREIGN PATENT DOCUMENTS

WO    WO2008039623  A1    4/2008

* cited by examiner

*Primary Examiner*—James H Cho
(74) *Attorney, Agent, or Firm*—Jackson Patent Law Office

(57) ABSTRACT

Disclosed is a design structure for systems and methods of managing a set of programmable fuses on an integrated circuit.

1 Claim, 5 Drawing Sheets

SYSTEM AND THE METHODS OF MANAGING A SET OF PROGRAMMABLE FUSES ON AN INTEGRATED CIRCUIT

This Application is a continuation-in-part of U.S. application Ser. No. 12/103,519 of JOHN ATKINSON FIFIELD and MICHAEL RICHARD OUELLETTE filed Apr. 15, 2008 for DESIGN STRUCTURE FOR SYSTEMS AND METHODS OF MANAGING A SET OF PROGRAMMABLE FUSES ON AN INTEGRATED CIRCUIT, the contents of which are herein incorporated by reference.

BACKGROUND OF THE INVENTION

1. Field of the Invention

This invention relates generally to a design structure for reconfigurable devices and, more particularly, to a design structure for systems and methods of managing a set of programmable fuses on an integrated circuit.

2. Description of Related Art

Electrically programmable fuses are employed in integrated circuits (ICs) for a number of purposes, including programming alterable circuit connections, or replacing defective circuit elements with redundant circuit elements.

To program a fuse element, a programming FET is connected to the fuse to pass the required programming current through the fuse. The gate voltage of the programming FET may be generated by a tester, or other apparatus external to the IC, during fuse programming and is selected based on the processing parametrics of the programming FET. For example, the gate control voltage may be connected to Vdd and the tester may set Vdd to the required gate voltage.

SUMMARY OF THE INVENTION

There is a design structure embodied in a machine readable medium for designing, manufacturing, or testing. The design structure comprises an integrated circuit comprising a voltage reference node configured to be connected to a reference voltage external to the integrated circuit; a first node configured to be connected to a first voltage source external to the integrated circuit, the first voltage source being for supplying a programming voltage; a second node configured to be connected to a second voltage source external to the integrated circuit, the second voltage source being for supplying a power voltage for operating the integrated circuit; a plurality of fuses, each having a first end, coupled to the first node, and a second end; a voltage divider having a voltage input, a voltage output, and a control input; and a multiplexer configured to selectively couple the voltage input to the first node or the second node. The multiplexer includes a first switch having a current input coupled to the first node, and a control input, and a second switch having a current input coupled to the second node, having a control input responsive to a voltage on the first node and responsive to a voltage on the second node. The integrated circuit further includes a plurality of transistors, each having a current path coupled to the second end of a respective fuse and a control input responsive to the voltage output of the voltage divider.

BRIEF DESCRIPTION OF THE DRAWINGS

References are made to the following text taken in connection with the accompanying drawings, in which.

The accompanying drawings which are incorporated in and which constitute a part of this specification, illustrate embodiments of the invention and, together with the description, explain the principles of the invention, and additional advantages thereof. Certain drawings are not necessarily to scale, and certain features may be shown larger than relative actual size to facilitate a more clear description of those features. Throughout the drawings, corresponding elements are labeled with corresponding reference numbers.

DETAILED DESCRIPTION OF EXEMPLARY EMBODIMENTS

First Exemplary Embodiment

Figure 1:
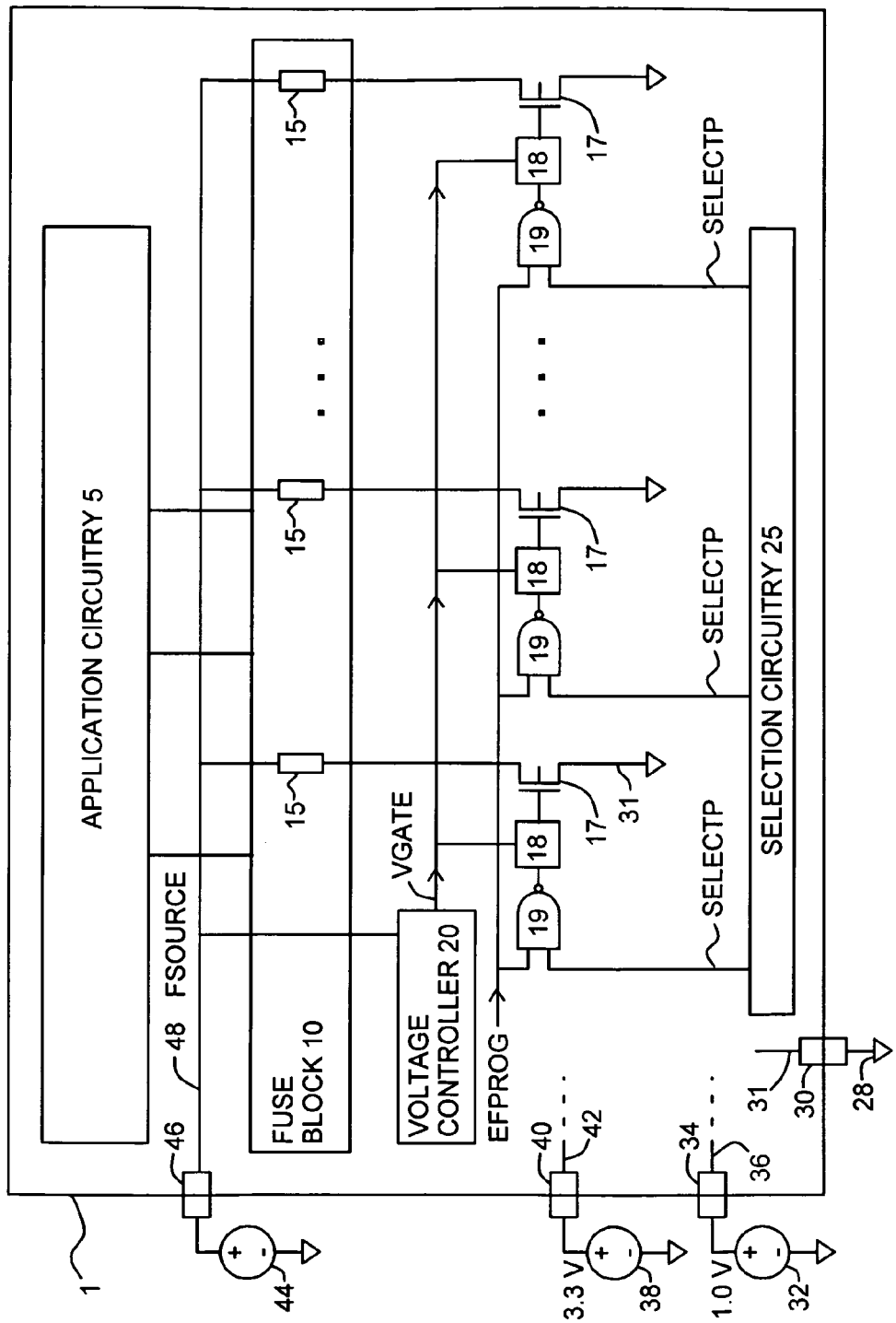
FIG. 1 is a diagram of an exemplary embodiment of the present invention.

FIG. 1 shows integrated circuit (IC) 1 on a common silicon substrate. IC 1 includes application circuitry 5 and fuse block 10 that affects or alters the operation of application circuitry 5. Fuse block 10 includes a plurality of fuses 15 each having a respective programming FET 17, level translator 18, and NAND gate 19. Selection circuitry 25 may include row-column addressing logic or a shift register having a bit for each NAND gate 19. Selection circuitry 25 has a respective output signal line ("SELECTP") coupled to each NAND gate 19.

Each fuse 15 may be formed from polysilicon. When a sufficient amount of current flows through a fuse 15, the fuse 15 heats up and alters its physical structure, causing a permanent increase in resistance.

Each fuse 15 can be individually selected and programmed by activating its respective FET 17, via its respective level translator 18. Each level translator 18 has an output applied to the gate of its respective FET 17. FET 17 has a current path coupled to a first end of fuse 15. A second end of fuse 15 is coupled to node 48, which is coupled to a programming supply voltage source ("FSOURCE") 44 via metallic lead 46 on IC 1. Programming voltage source 44 is external to the IC 1.

Level translator, or shifter, 18 receives a digital signal from NAND gate 19, and receives an analog signal ("VGATE") from voltage controller 20. The output generated by level translator 18 will be either 0 or VGATE, depending on the input received from NAND gate 19. Level translator 18 may be conceptualized as an inverter having an output high level defined by VGATE.

A ground node 31 is connected to a reference node 28 external to IC 1, via metallic lead 30 on IC 1.

A Vdd voltage supply node 36 is connected to a voltage source 32, nominally operating at 1.0 V, external to IC 1, via metallic lead 34 on IC 1.

(To simplify the drawings, reference numerals will sometimes not be repeated for structures that have already been identified.)

A node 42 is connected to a 3.3 V voltage source 38 external to IC 1, via metallic lead 40 on IC 1.

Figure 2:
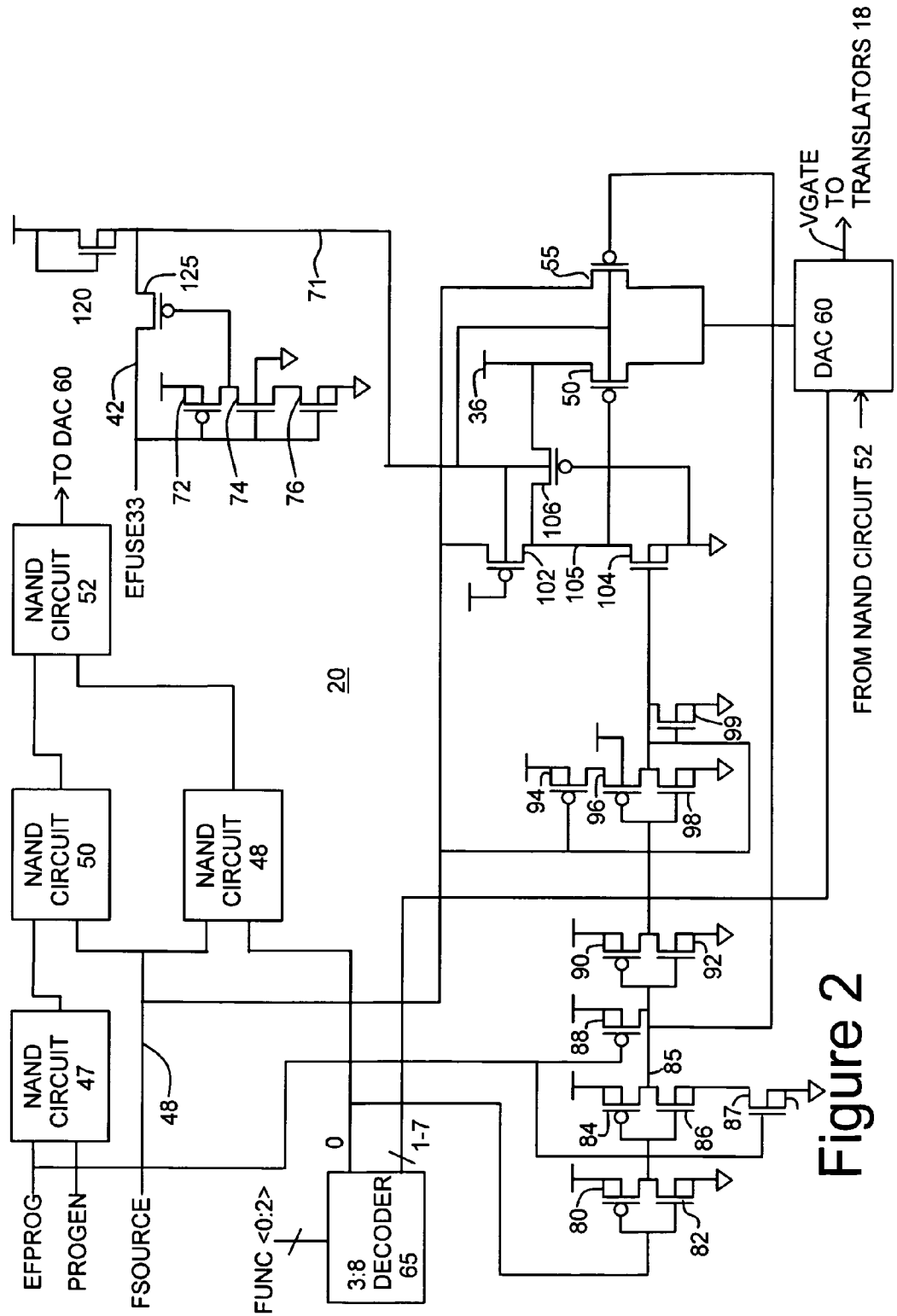
FIG. 2 is a diagram emphasizing an aspect of the system shown in FIG. 1.

FIG. 2 shows voltage controller 20 in more detail. Controller 20 includes PFETs 50 and 55, acting to multiplex (select) between Vdd and FSOURCE. More specifically, PFET 50 is configured to pass a first power supply, (IC Vdd), to digitalto-analog converter (DAC) 60 device. PFET 55 is configured to pass a second power supply voltage (FSOURCE) to DAC 60.

DAC 60 includes a resistor divider network controlled by bits 1-7 from 3:8 decoder 65 and 1 bit from NAND circuit 52. Thus, the 3 bits (FUNC<0:2>) applied to decoder 65 determine the division of FSOURCE down to a specified programming voltage level; applied to the gate of the programming FET 17.

FSOURCE can be greater than Vdd.

Modes of operation:

Voltage controller 20 could be deemed to have four operating modes: Fuse Read, Resistance Check, Program Mode 1 and Program Mode 2.

| MODE | VGATE | FSOURCE | FUNC<0:2> | EFPROG | PROGEN |
|---|---|---|---|---|---|
| Read Mode | Vdd | 0.0 V | X | 0 | X |
| Resistance Check | Vdd | ~0.1 V | 0 | X | X |
| Programming Mode_1 | F(FSOURCE, FUNC<0:2>) | 3.0-3.3 V | 1-7 | 1 | 1 |
| Programming Mode_2 | Vdd | 3.0-3.3 V | 0 | 1 | 1 |

When the FSOURCE is 0 volts and EFPROG inputs are held to logic 0, the voltage selector is in Read Mode and Vdd is passed to the DAC 60. The DAC 60 is set to 100% ratio so output VGATE=Vdd.

When the control inputs FUNC<0:2> are set to logic 000, and FSOURCE is below a threshold voltage Vtn, (essentially logical '0') voltage controller 20 is in Resistance Check Mode and Vdd is passed to the DAC 60. The DAC 60 is set to 100% ratio so output VGATE=Vdd. Resistance check mode enables analog measurement of a fuse element 15 and is a characterization test mode.

When the control inputs FUNC<0:2> are set to non-zero values (001-111), and FSOURCE is greater than Vdd, and EFPROG=logic 1 and PROGEN=logic 1, voltage controller 20 is in Programming Mode_1 and FSOURCE is passed to DAC 60. The DAC 60 ratio is adjusted by the control inputs FUNC<0:2> and a fraction of programming voltage FSOURCE is generated as VGATE, to provide a variable programming gate voltage.

When the control inputs FUNC<0:2> are set to logic 000, and FSOURCE is greater than Vdd, and EFPROG=logic 1 and PROGEN=logic 1, voltage controller 20 is in Programming Mode_2 and Vdd is passed to the DAC 60. The DAC 60 will generate Vdd as VGATE, to provide Vdd level as the programming gate voltage 40.

A low current signal line constituting node 42, EFUSE33, is held at 3.3V. The N-Wells of PFET 50 and PFET 55 are connected to node 71, NFET diode 120, and a PFET pass device 125. The PFET pass device 125 is configured to pass EFUSE33 when EFUSE33 is sufficient to turn on an inverter stack constituted by PFET 72 and weak NFETS 74 and 76, thereby effecting a HIGH trip point. The voltage on node 71 is the greater of EFUSE33 and (Vdd—threshold voltage of NFET diode 120). In other words, the voltage on node 71 is conditionally a diode drop below the Vdd power supply or EFUSE33 without a diode drop.

During power-up, if EFUSE33 comes up after Vdd, N-WELL forward biasing of PFETs 50 and 55 is prevented.

The impedance per unit length of the conductive path constituting node 42, between PFET 125 and lead 40 (FIG. 1), is substantially the same as that of the path that carries the signal EFPROG. This impedance per unit length of node 42 is at least 10 times greater than the impedance per unit length of node 36, the line that carries the Vdd.

A voltage on node 85 drives the gate of PFET 55. The voltage on node 85 is generated by a NAND/inverter function formed by PFET 88, PFET 84, NFET 86, NFET 87, PFET 80, and NFET 82.

PFET 102, PFET 106, and NFET 104 constitute a level translator having a node 105 that drives the gate of PFET 50.

The gate of NFET 104 is driven by a NAND circuit constituted by PFET 94, PFET 96, NFET 98 and NFET 99. This NAND circuit and level translator effect a conditional level translation that shuts off the gate of PFET 50 with a gate voltage equal to FSOURCE level, preventing FSOURCE current from leaking back to Vdd in Programming mode. The level translator is configured to work when FSOURCE is close to Vdd, because PFET 106 (resistive device—linear region) will charge the gate of PFET 50 to Vdd after pullup device PFET 102 cuts off when FSOURCE 35 is less than a Vt above Vdd.

Thus, the level translator provides a gate voltage to shut off PFET 50. This gate voltage can be equal to FSOURCE voltage when PFET 55 is selected.

This level translator functions when the high level supply, FSOURCE, is at 0 volts.

The circuit of PFET 102, PFET 106, and NFET 104 can provide a 'low' or 0 volt output, and a 'high' level output of Vdd when FSOURCE is 0V, or a 'high' level output of FSOURCE voltage when FSOURCE is above Vdd level.

Thus, this circuit allows selection of FSOURCE and passing of its level to DAC 60 when FSOURCE level is approximately 100 mv (essentially a logic 'low' level) for the purpose of checking the resistance of a fuse element.

Figure 3:
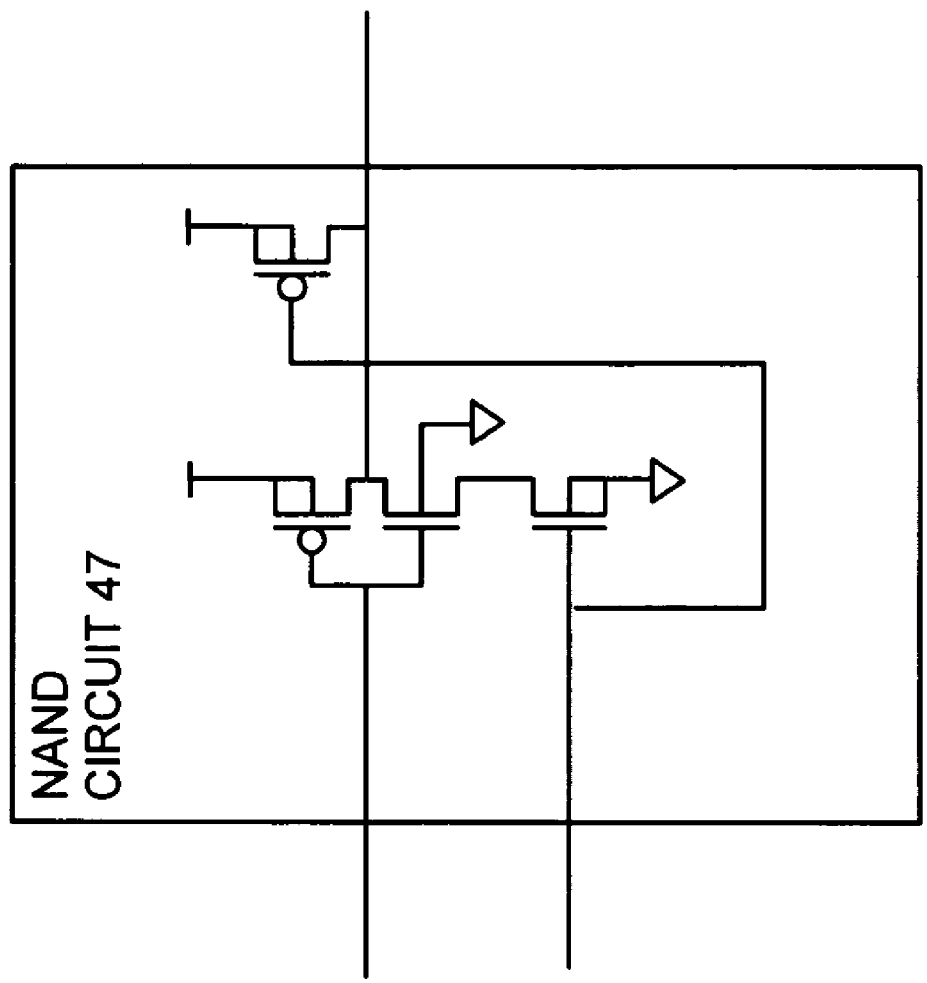
FIG. 3 is a diagram emphasizing an aspect of the system shown in FIG. 2.

FIG. 3 shows NAND circuit 47 in more detail. Each of NAND circuits 48, 50, and 52 the same structure as that of NAND circuit 47.

Figure 4:
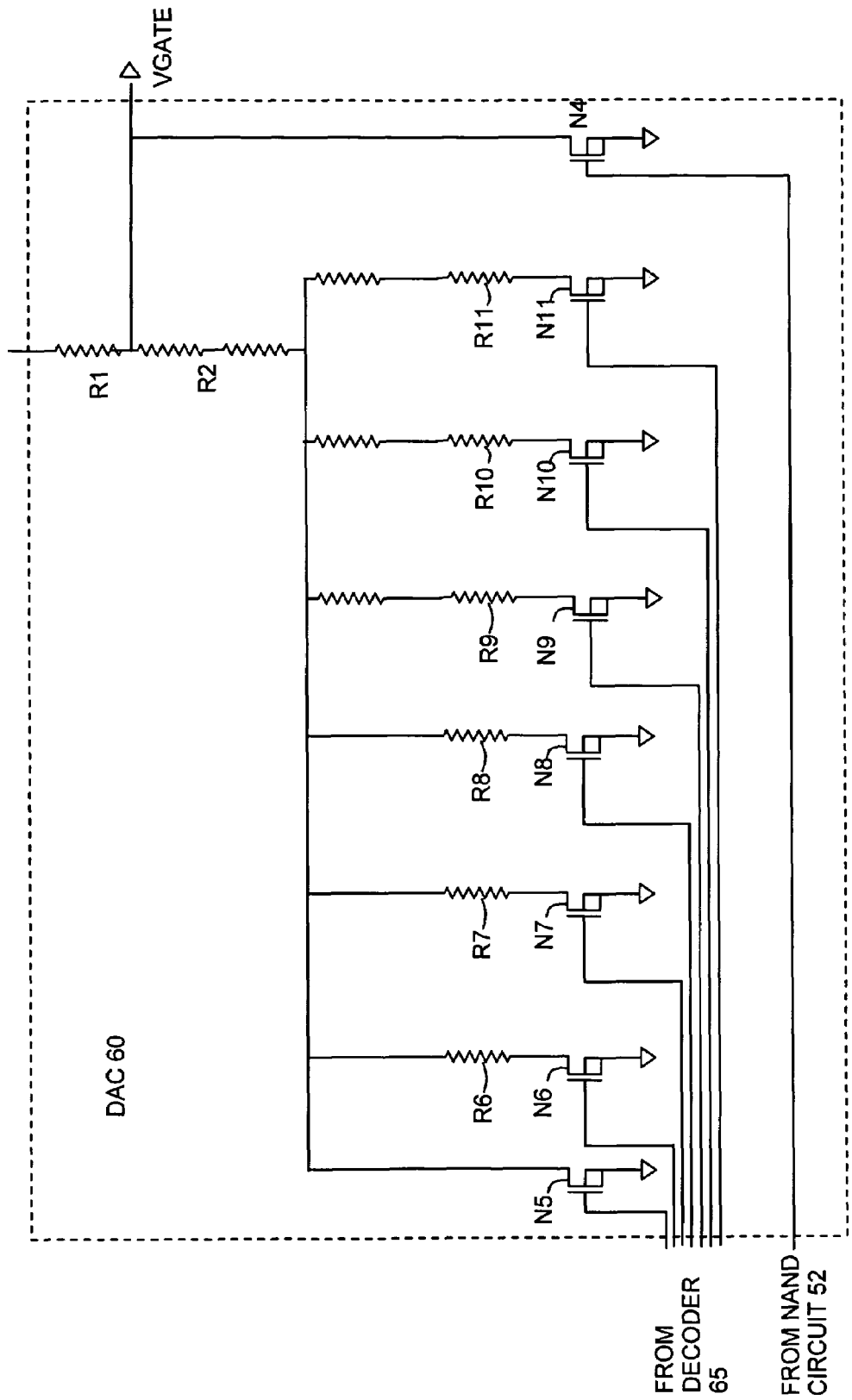
FIG. 4 is a diagram of a digital-to-analog converter that can be used to implement a function shown in FIG. 2.

FIG. 4 is a diagram of a digital-to-analog converter that can be used to implement a function shown in FIG. 2.

Figure 5:
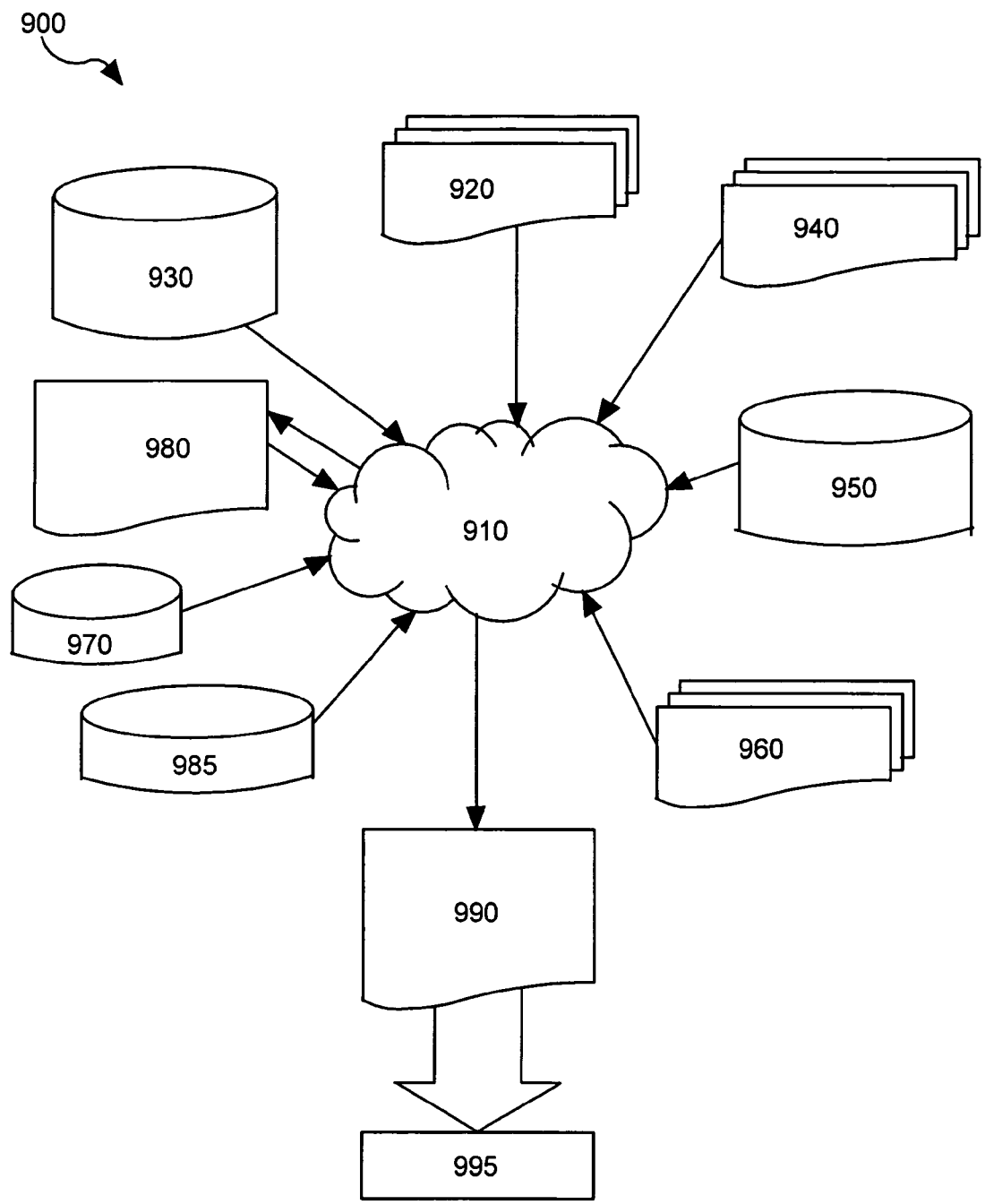
FIG. 5 is a flow diagram of a process used in semiconductor design, manufacture, and/or test.

FIG. 5 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1, 2, 3, and 4 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 1, 2, 3, and 4. Design process 910 preferably synthesizes (or translates) an embodiment of the invention as shown in FIGS. 1, 2, 3, and 4 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1, 2, 3, and 4, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 3, and 4.

Design structure 990 may then proceed to a stage 995 where, for example, design structure 990: proceeds to tape-out, is released to manufacturing, is released to a mask house, is sent to another design house, is sent back to the customer, etc.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims. In general, the words "first," "second," etc., employed in the claims do not necessarily denote an order.

What is claimed is:

1. An integrated circuit comprising:
    a voltage reference node configured to be connected to a reference voltage external to the integrated circuit;
    a first node configured to be connected to a first voltage source external to the integrated circuit, the first voltage source being for supplying a programming voltage;
    a second node configured to be connected to a second voltage source external to the integrated circuit, the second voltage source being for supplying a power voltage for operating the integrated circuit;
    a plurality of fuses, each having a first end, coupled to the first node, and a second end;
    a voltage divider having a voltage input, a voltage output, and a control input;
    a multiplexer configured to selectively couple the voltage input to the first node or the second node, the multiplexer including
        a first switch having a current input coupled to the first node, and a control input, and
        a second switch having a current input coupled to the second node, having a control input responsive to a voltage on the first node and responsive to a voltage on the second node; and
    a plurality of transistors, each having a current path coupled to the second end of a respective fuse, and a control input responsive to the voltage output of the voltage divider.

* * * * *